(12) United States Patent
Ogawa

(10) Patent No.: US 8,248,854 B2
(45) Date of Patent: Aug. 21, 2012

(54) SEMICONDUCTOR MEMORY DEVICE

(75) Inventor: Mikio Ogawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 160 days.

(21) Appl. No.: 12/884,535

(22) Filed: Sep. 17, 2010

(65) Prior Publication Data

US 2011/0176364 A1 Jul. 21, 2011

(30) Foreign Application Priority Data

Jan. 15, 2010 (JP) ................................. 2010-007363

(51) Int. Cl.
*G11C 16/04* (2006.01)
(52) U.S. Cl. ............................... 365/185.18; 365/185.12
(58) Field of Classification Search ............. 365/185.18, 365/185.12, 185.11, 185.03
See application file for complete search history.

(56) References Cited

U.S. PATENT DOCUMENTS

| | | | |
|---|---|---|---|
| 5,546,341 A | 8/1996 | Suh et al. | |
| 6,031,764 A | 2/2000 | Imamiya et al. | |
| 6,459,612 B2 * | 10/2002 | Satoh et al. | 365/185.03 |
| 8,149,629 B2 * | 4/2012 | Shibata et al. | 365/185.27 |
| 2009/0244968 A1 * | 10/2009 | Maejima | 365/185.03 |
| 2010/0118605 A1 * | 5/2010 | Shibata et al. | 365/185.03 |

FOREIGN PATENT DOCUMENTS

JP 2001-273798 10/2001

* cited by examiner

*Primary Examiner* — Anh Phung
(74) *Attorney, Agent, or Firm* — Oblon, Spivak, McClelland, Maier & Neustadt, L.L.P.

(57) ABSTRACT

According to one embodiment, a semiconductor memory device includes a semiconductor substrate which includes a well. A memory cell array includes memory cells each including a floating gate electrode above the well and a control gate electrode above the floating gate electrode, and is configured to write data in units of pages each including memory cells connected in series and to erase data in units of blocks each includes a plurality of the pages. A control gate line is selectively electrically connected to the control gate electrodes of at least one of the blocks. A first switching element includes a current path having ends connected to the control gate line and a ground end. The well is charged, and the first switching element is turned off before the end of the discharge of the well.

10 Claims, 5 Drawing Sheets

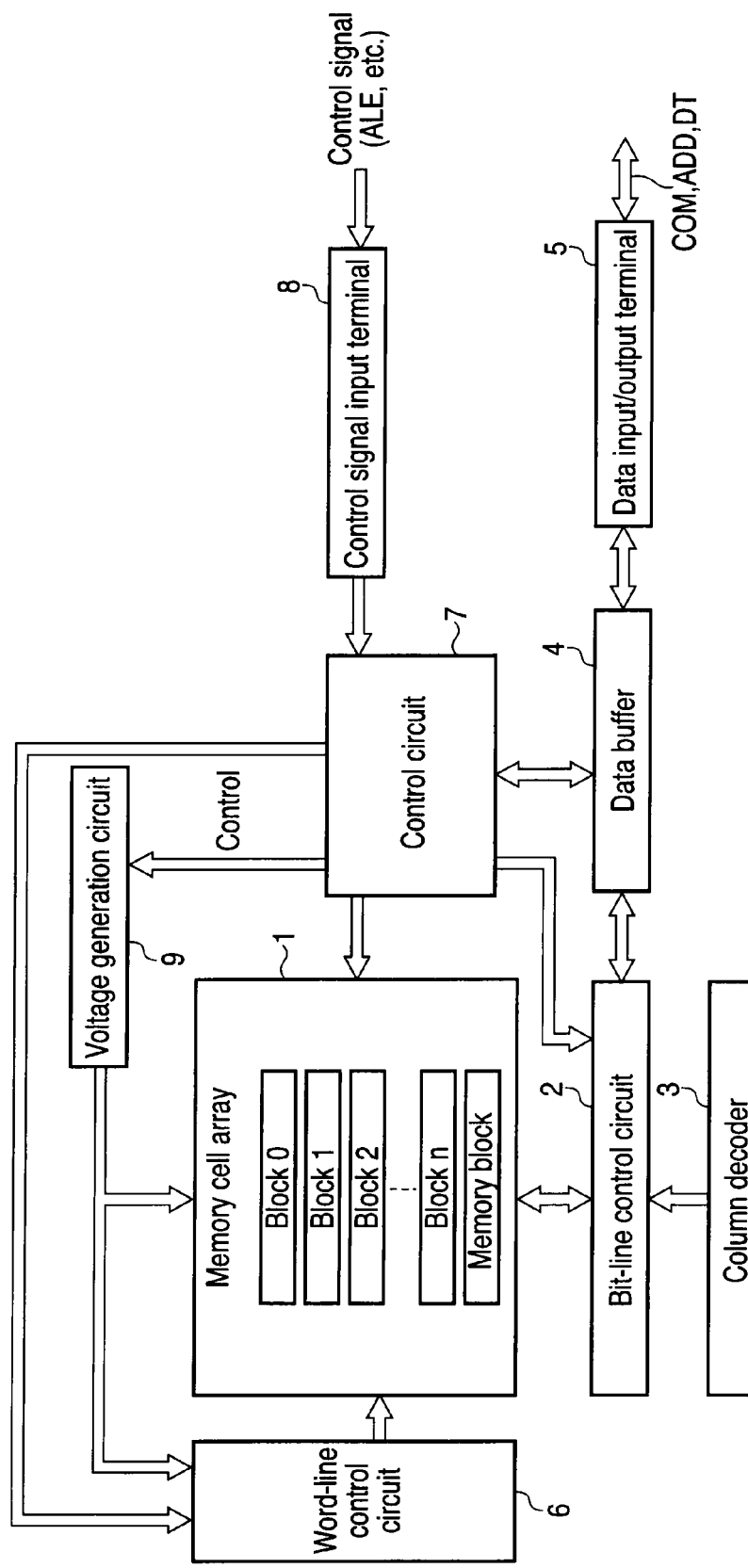
F I G. 1

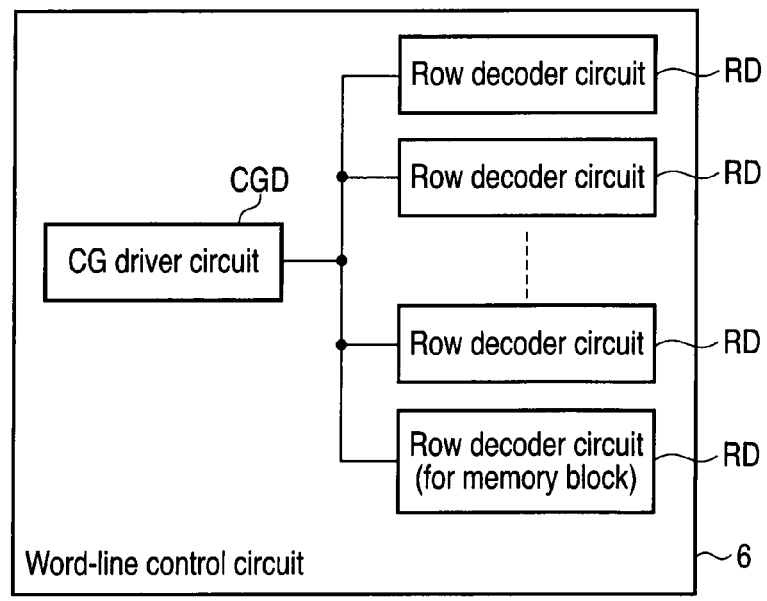
F I G. 4
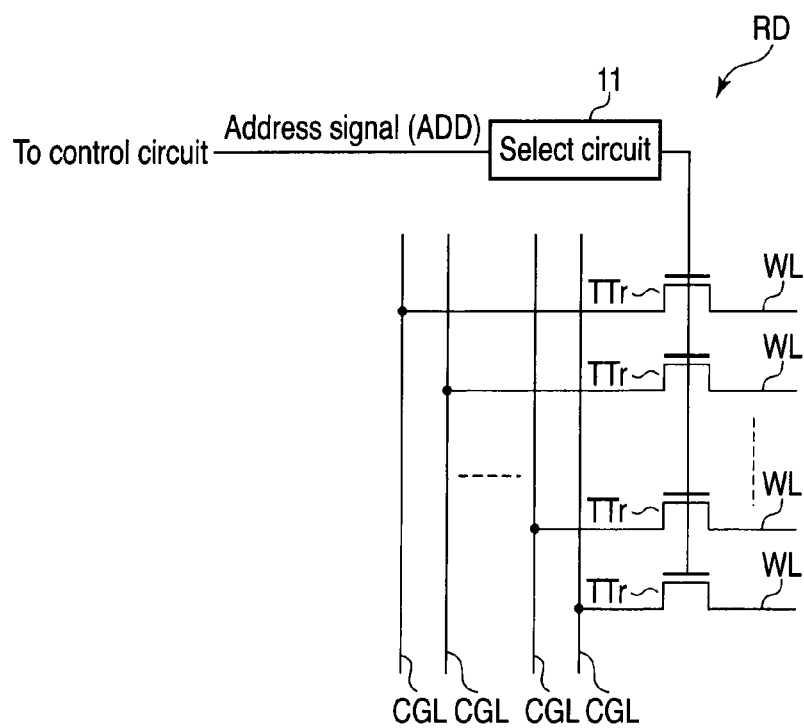
F I G. 5

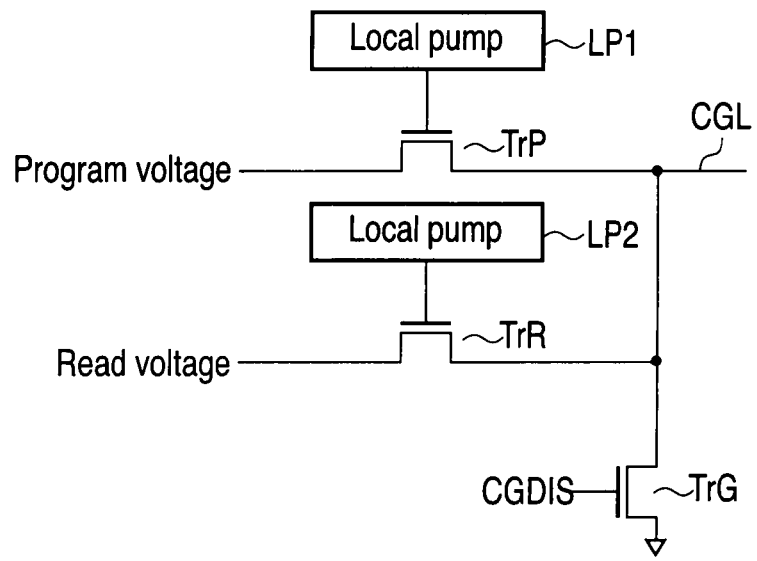
F I G. 8
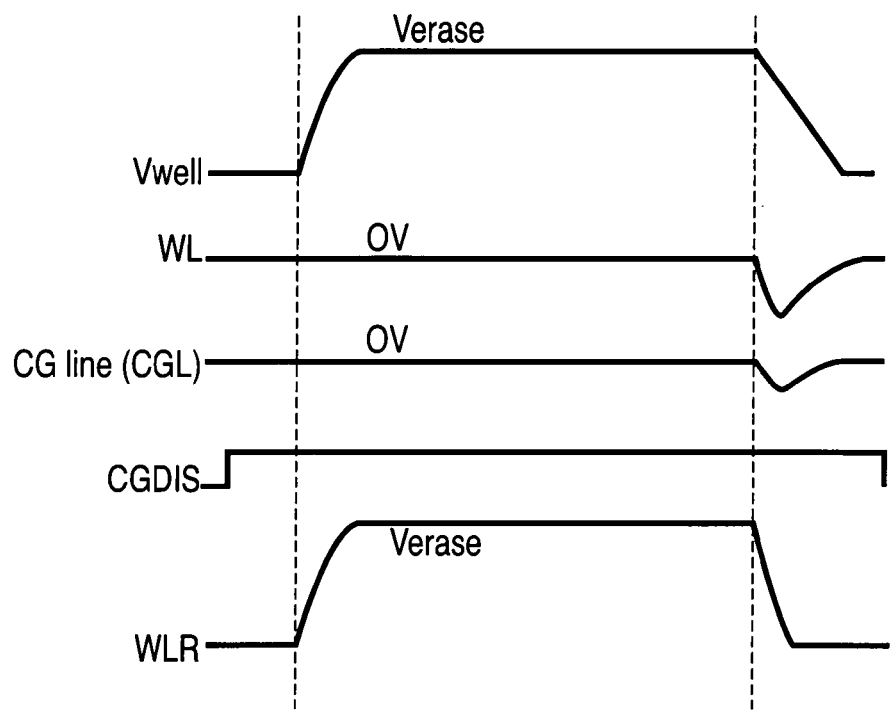
F I G. 9

US 8,248,854 B2

SEMICONDUCTOR MEMORY DEVICE

CROSS-REFERENCE TO RELATED APPLICATIONS

This application is based upon and claims the benefit of priority from Japanese Patent Application No. 2010-007363, filed Jan. 15, 2010; the entire contents of which are incorporated herein by reference.

FIELD

Embodiments described herein relate generally to a semiconductor memory device such as a NAND electrically erasable programmable read-only memory (EEPROM).

BACKGROUND

In a NAND EEPROM flash memory, data is written in units of memory regions of a predetermined size (pages) and erased in block units each consisting of a plurality of continuous pages. The design of the flash memory allows, in addition to the erasure of individual blocks, entire block erasure. Entire block erasure is an operation of collectively erasing the data of all blocks in the flash memory, and is used, for example, during a chip test.

In certain cases, a memory needs to hold information necessary for its operation. Such information includes that specifying the operating voltage or defining alternative circuitry for realizing redundancy. In a dynamic random access memory (DRAM), this operating information is programmed using laser fuses, but in a flash memory, it is programmed in a ROM block. The ROM block is a region allocated, from among all the blocks, to storing the information necessary for the operation of the flash memory. The information in the ROM block is stored in a nonvolatile manner and read during power-up of the flash memory.

The ROM block is only distinguished from the other blocks that store normal data by address. Because targets for entire block erasure also include the ROM block, it is possible to erase the data of the ROM block by entire block erasure. However, since this must not be allowed to happen, a measure to avoid erasing data in the memory cells of the ROM block during entire block erasure is necessary.

BRIEF DESCRIPTION OF THE DRAWINGS

FIG. 1 is a block diagram of an entire constitution example of a semiconductor memory device according to one embodiment;

FIG. 4 is a block diagram showing a specific example of a word-line control circuit according to the embodiment;

FIG. 5 shows a specific example of a row decoder circuit according to the embodiment;

FIG. 8 is a diagram of the control gate line driver circuit; and

FIG. 9 shows the potential of the main part of the semiconductor memory device.

DETAILED DESCRIPTION

Figure 2:
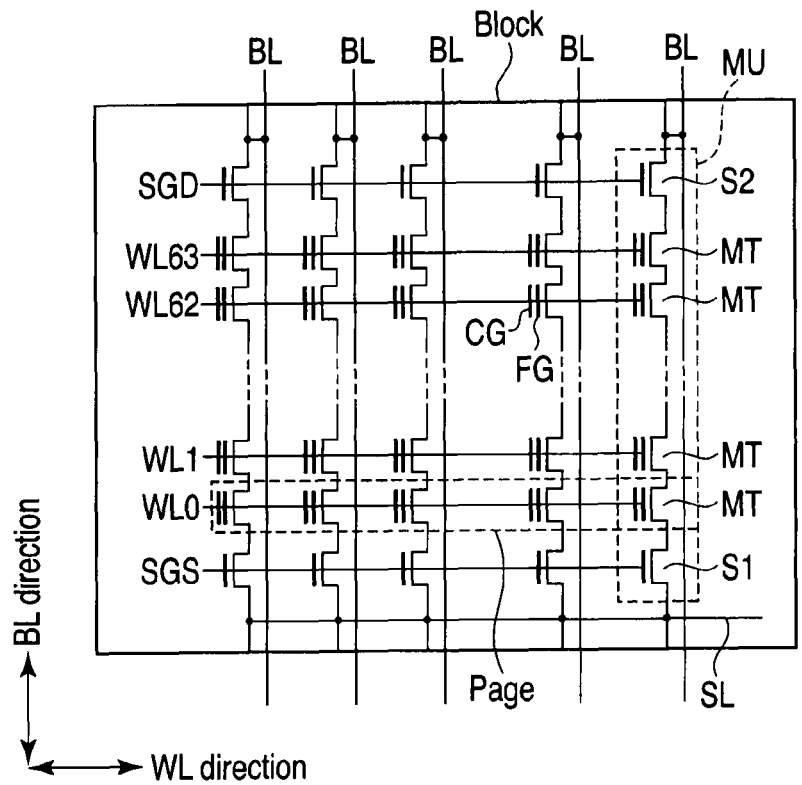
FIG. 2 is a circuit diagram of a specific example of a block.

In general, according to an embodiment, a semiconductor memory device includes a semiconductor substrate which includes a well. The device includes a memory cell array which comprises memory cells each comprising a floating gate electrode above the well and a control gate electrode above the floating gate electrode, and configured to write data in units of pages each comprising memory cells connected in series and to erase data in units of blocks each comprising a plurality of the pages. The device includes a control gate line selectively electrically connected to the control gate electrodes of at least one of the blocks. The device includes a first switching element which comprises a current path having ends connected to the control gate line and a ground end. The well is charged, and the first switching element is turned off before the end of the discharge of the well.

Each control gate line CGL in each block is connected to a control gate line driver circuit shown in FIG. 8. In the control gate line driver circuit, all the control gate lines are grounded via a transistor TrG. A signal CGDIS is applied to the gate of transistor TrG. A program (write) voltage and a read voltage are applied to the control gate lines CGL via transistors TrP and TrR.

To erase the blocks in the above constitution, a potential of each part is controlled as follows. First, a transfer transistor of the block targeted to be erased is turned on, and then the signal CGDIS is made high to allow the transistor TrG to conduct, thereby holding the control gate lines CGL at 0 V. Afterward, the potential of a well is raised to an erase voltage. Consequently, a potential difference is made between the well and a floating gate electrode of each memory cell in the block targeted to be erased, and electrons in the floating gate electrode are extracted to the well. During entire block erasure, the transfer transistors of all the blocks are allowed to conduct.

As described above, it is necessary to avoid erasing data in the ROM block. Therefore, for example, a transfer transistor of the ROM block is kept off. Consequently, word lines in the ROM block are made to float. Thus, the coupling between well having the voltage raised to the erase voltage and the word lines in the ROM block word lines raises the voltage of the ROM block word lines to the erase voltage, and any potential difference is not made between the floating gate and the well. In this way, erasure of the data in the memory cells of the ROM block is avoided.

According to such a technique, the following phenomenon occurs. FIG. 9 shows the variance of the potential of the main part for performing entire block erasure. As shown in FIG. 9 and as described above, signal CGDIS is made high to hold the control gate line CGL at 0 V. Moreover, the transfer transistor of the ROM block is kept off, and transfer transistors of the other blocks (blocks to be erased) are turned on. Subsequently, a well potential Vwell is raised to an erase potential Verase. Consequently, a potential of the word lines WLR in the ROM block is raised in the same manner as in the well potential because of the coupling, while word lines WL of each block to be erased stay at 0 V. Consequently, the electrons are extracted only from the floating gates of the memory cells in the blocks to be erased.

With the completion of the erasure, the well voltage Vwell is discharged. At this time, the potential of the word lines WL of the blocks to be erased drops to a negative value because of coupling between the word lines Wl and the well voltage Vwell. The control gate lines CGL connected to the word lines WL in the blocks to be erased are intended to maintain 0 V through grounding. However, the negative potential of the word lines WL of the blocks to be erased is large, and hence the control gate lines CGL cannot be kept at 0 V, resulting in the control gate lines CGL also with a negative potential. Then, the source potential of the transfer transistor of the ROM block is a control gate line potential (negative potential), the gate potential is zero, and the drain potential is the voltage (erase voltage Verase) of the word lines WLR. Consequently, a large potential difference is made between the gate and the source of this transfer transistor, and a current IDS through the source and the drain of the transfer transistor increases, whereby the potential of the word lines WLR in the ROM block is discharged earlier than the well voltage Vwell. Consequently, a potential difference is made between control gates of the memory cells in the ROM block and the well potential Vwell, to erase the data in the ROM block.

Hereinafter, embodiments of the present invention having a constitution based on the above finding will be described with reference to the drawings. It is to be noted that in the following description, constituent elements having substantially the same function and constitution are denoted with the same reference numerals, and duplicate description thereof is performed only if necessary. It is to be noted that the drawings are exemplary, and a relation between a thickness and a planar dimension, a ratio of layer thicknesses and the like are different from realities. Therefore, specific thicknesses or dimensions are to be judged by taking the following description into account. Moreover, needless to say, the drawings include mutually different dimensional relations and ratios.

An example of the whole constitution of a semiconductor memory device according to the embodiment will be described with reference to FIG. 1. As shown in FIG. 1, a NAND flash memory according to the present embodiment includes a memory cell array 1, a bit-line control circuit 2, a column decoder 3, a data buffer 4, a data input/output terminal 5, a word-line control circuit 6, a control circuit 7, a control signal input terminal 8 and a voltage generation circuit 9.

The memory cell array 1 includes a plurality of blocks (block 0 to block n) and at least a memory block (ROM block). Each of the blocks includes a plurality of memory cells, word lines, bit lines and the like. The block is constituted of a plurality of pages comprising the plurality of memory cells as described later in detail. The memory cell array 1 is electrically connected to the bit-line control circuit 2, the word-line control circuit 6, the control circuit 7 and the voltage generation circuit 9. The memory block holds information necessary for an operation thereof. Such information includes that specifying the operating voltage or defining alternative circuitry for realizing redundancy. In the memory block, data by a user of the semiconductor memory device is not stored.

The bit-line control circuit 2 reads the data of the memory cells in the memory cell array 1 via the bit lines, and detects the state of the memory cells in the memory cell array 1 via the bit lines. Moreover, the bit-line control circuit 2 applies the write (program) voltage to the memory cells in the memory cell array 1 via the bit lines to write the data in the memory cells. The bit-line control circuit 2 is electrically connected to the column decoder 3, the data buffer 4 and the control circuit 7.

The bit-line control circuit 2 includes a sense amplifier (S/A), a data memory circuit and the like (not shown). This data memory circuit is selected by the column decoder 3. The data of the memory cells read by the data memory circuit is output to the outside through the data input/output terminal 5 via the data buffer 4. The data input/output terminal 5 is connected to, for example, a device outside the NAND flash memory. The data input/output terminal 5 receives various commands COM to control the operation of the NAND flash memory, receives an address ADD and receives or outputs data DT. The write data DT input into the data input/output terminal 5 is supplied to the above data memory circuit selected by the column decoder 3 via the data buffer 4. On the other hand, the commands COM and the address ADD are supplied to the control circuit 7.

The word-line control circuit 6 selects a word line in the memory cell array 1 under the control of the control circuit 7. Moreover, the word-line control circuit 6 receives, from the voltage generation circuit 9, a voltage necessary for reading, writing or erasing the data. The word-line control circuit 6 applies this voltage to the selected word line.

The control circuit 7 is electrically connected to the memory cell array 1, the bit-line control circuit 2, the column decoder 3, the data buffer 4, the word-line control circuit 6 and the voltage generation circuit 9, to control these components. The control circuit 7 is connected to the control signal input terminal 8, and is controlled by a control signal such as an address latch enable (ALE) signal input from the outside via the control signal input terminal 8. The control circuit 7 outputs a control signal described later to the voltage generation circuit 9 to control the voltage generation circuit 9.

The voltage generation circuit 9 applies a necessary power voltage to the memory cell array 1, the word-line control circuit 6 and the like under the control of the control circuit 7 during operations such as writing, reading and erasing operations.

Next, a constitution example of a block Block will be described with reference to FIG. 2. Here, the one block Block will be described as an example. Moreover, the data of memory cell transistors MT in the block Block is collectively erased. That is, the block is an erase unit.

Figure 3:
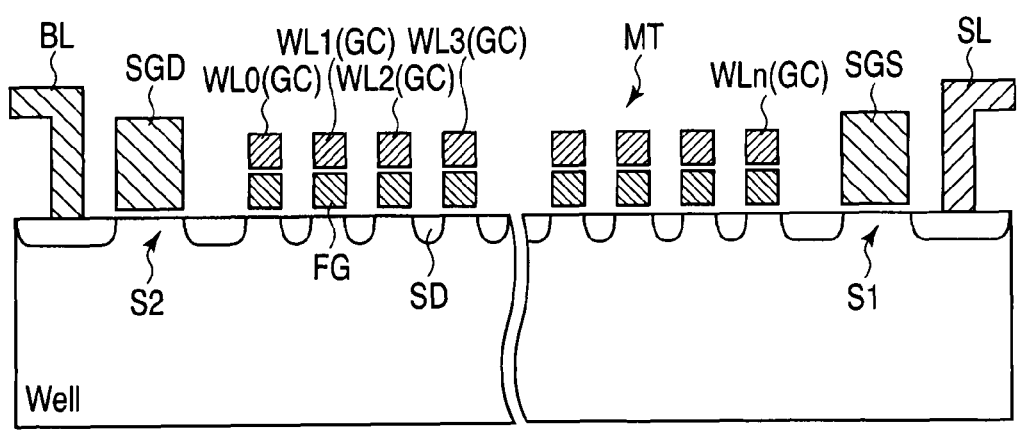
FIG. 3 is a sectional view of the specific example of the block.

As shown in FIGS. 2 and 3, the block Block includes a plurality of memory cell columns (memory cell units) MU arranged along a word-line direction (WL direction). Each of the memory cell columns MU is constituted of a NAND string and select transistors S1 and S2. The NAND string is constituted of a plurality of (e.g., 64) memory cell transistors MT including current paths (sources/drains SD) mutually connected in series. Select transistors S1 and S2 are connected to both ends of the NAND string, respectively. The other end of the current path of select transistor S2 is connected to a bit line BL, and the other end of the current path of select transistor S1 is connected to the source line SL.

Word lines WL0 to WL63 extend in the WL direction, and are connected to the plurality of memory cell transistors MT which belong to the same row. A select gate line SGD extends in the WL direction, and is connected to all select transistors S2 in the block. A select gate line SGS extends in the WL direction, and is connected to all select transistors S1 in the block.

The plurality of memory cell transistors MT connected to the same word line WL constitute a unit referred to as the page. The read operation or the write operation is performed for each page. It is to be noted that in a case where one memory cell is a multi-valued memory cell which can hold data of a plurality of bits, a plurality of pages are assigned to one word line.

The memory cells MT are disposed in intersections of the bit lines BL and the word lines WL, and are disposed on a well formed in a semiconductor substrate. The well is connected to the voltage generation circuit 9, and the voltage generation circuit 9 applies a specific voltage to the well. Each of the memory cells MT has a tunnel insulation film (not shown), a floating electrode (floating gate electrode) FG as a charge accumulation layer, an inter-gate insulation film (not shown), a control electrode (control gate electrode) CG (word line) which are laminated on the well, and the source/drain region SD. The source/drain, which is the current path of the memory cell MT, is connected in series to the source/drain of the adjacent memory cell MT. Select transistors S1 and S2 include a gate insulation film (not shown), gate electrodes SGS and SGD which are laminated on the semiconductor substrate, and the source/drain region SD.

FIG. 4 is a block diagram showing a specific example of the word-line control circuit 6 according to the present embodiment. As shown in FIG. 4, the word-line control circuit 6 includes a plurality of row decoder circuits RD and a control gate line driver circuit CGD. All the control gate lines connected to the row decoder circuits RD are connected to the same CG driver circuit CGD. At least one of the row decoder circuits RD is connected to the word lines WL of the memory block.

FIG. 5 is a circuit diagram showing a specific example of one row decoder circuit RD according to the present embodiment. Each of the word lines WL is connected to one end of the current path of a transferring switching element (e.g., a field-effect transistor [FET]) TTr. The other end of the current path of each of the transfer transistors TTr is connected to each control gate line CGL. Gate electrodes of the transfer transistors TTr are connected in common to a select circuit 11. The select circuit 11 is connected to all the transfer transistors TTr in the same row decoder circuit RD. One of the select circuits 11 designated by the address signal ADD supplied form the control circuit 7 turns on the transfer transistors TTr. That is, the on/off states of the transfer transistors TTr can be controlled in block units.

Figure 6:
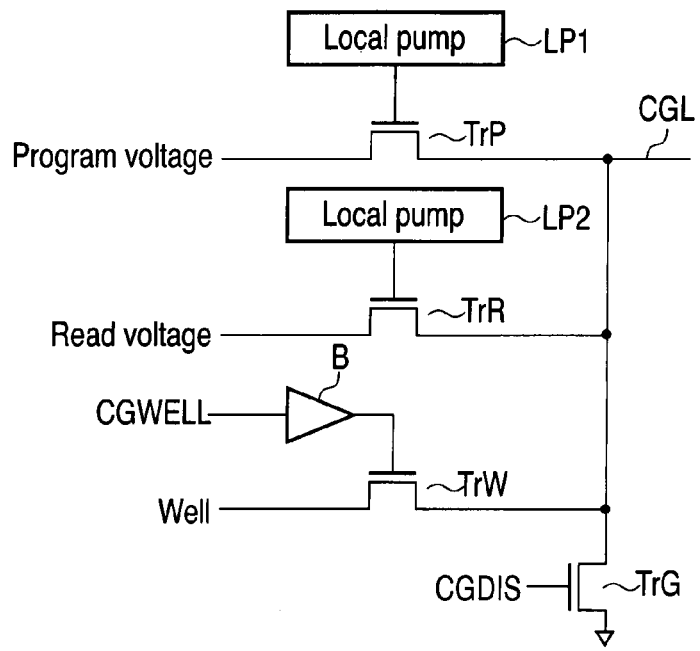
FIG. 6 shows a specific example of a control gate line driver circuit according to the embodiment.

FIG. 6 is a circuit diagram showing a specific example of the control gate line driver circuit CGD according to the present embodiment. The control gate line CGL in each of the row decoder circuits RD is connected in common to one end of each of current paths of switching elements TrP and TrR each comprising, for example, an n-type FET. The voltage generation circuit 9 applies the program voltage and the read voltage to the other ends of the current paths of transistors TrP and TrR, respectively. Gate electrodes of transistors TrP and TrR are connected to local pumps LP1 and LP2, respectively. The local pumps LP1 and LP2 turn on and off transistors TrP and TrR under the control of the control circuit 7 during the writing and reading.

The control gate line CGL is connected to one end of the current path of the switching element TrG comprising, for example, an n-type FET. The other end of the current path of transistor TrG is grounded. The signal CGDIS from the control circuit 7 is applied to the gate electrode of the transistor TrG. The transistor TrG is turns on and off in accordance with the signal CGDIS.

Moreover, the control gate line CGL is connected to one end of a current path of a switching element comprising, for example, an n-type transistor TrW. The other end of the current path of the transistor TrW is electrically connected to the well of the memory cell array. A signal CGWELL from the control circuit 7 is applied to the gate electrode of the transistor TrW via a buffer circuit B.

Figure 7:
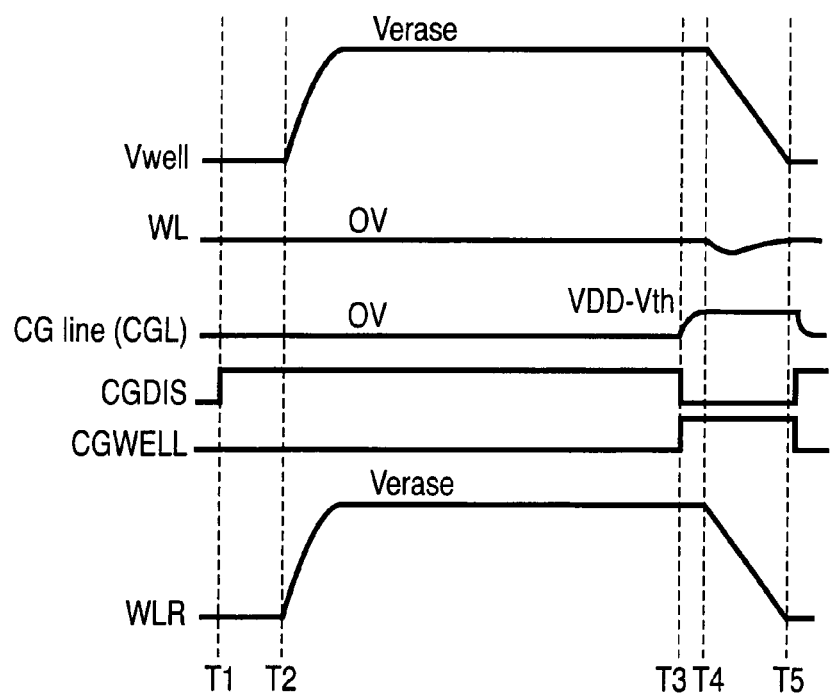
FIG. 7 shows the potential of the main part of the semiconductor memory device according to the embodiment.

Next, an entire block erasing operation of the NAND flash memory having the above constitution will be described with reference to FIG. 7. FIG. 7 shows the potential of the main part of the NAND flash memory according to the present embodiment.

An operation up to immediately before the end of entire block erasure is the same as FIG. 9. That is, first, at the start of the entire block erasure, the transfer transistors TTr for all the blocks (blocks to be erased) excluding the memory block are turned on. Consequently, all the word lines WL in blocks to be erased are electrically connected to the control gate line CGL. On the other hand, the transfer transistor TTr for the memory block remains off. Consequently, all the word lines WL in the memory block are made to float electrically. Signal CGDIS, signal CGWELL and the word line WL and the control gate line CGL of the blocks to be erased are 0 V.

At time T1, the signal CGDIS is made high. Consequently, the transistor TrG turns on, and 0 V is applied to the control gate line CGL.

Next, at time T2, the well voltage Vwell is raised to the erase voltage Verase. The potential of the word line WL in the blocks to be erased stays at 0 V, because 0 V is applied via the transfer transistor TTr and the transistor TrG. The resultant potential difference between the word line (control gate electrode) WL and the well in the blocks to be erased extracts the electrons in the floating gate electrode of the blocks to be erased to the well. On the other hand, the word line WLR in the memory block is made to float and is, accordingly, coupled with the well, so that the potential of the word line varies in the same manner as in the well voltage Vwell to rise to Verase. Therefore, in the memory block, any potential difference is not made between the word line (control gate electrode) WLR and the well, and the data is kept.

After the elapse of time necessary for erasing the data, at time T3, the signal CGDIS is made low, and the transistor TrG turns off. Moreover, at the time T3, the signal CGWELL is made high, and the transistor TrW turns on. When these transistors turn on and off, the control gate line CGL switches from a state where the line is held at 0 V to a state where the line is connected to the well. Consequently, the positive well voltage Vwell is applied to the control gate line CGL, and the potential thereof rises to VDD-Vth. VDD is a power potential, and Vth is a threshold voltage of the transistor TrG.

Next, at time T4, the discharge of the well voltage Vwell is started. At this start of the discharge, the potential of the word line WLR of the memory block drops. Moreover, with the discharge, the potential of the word lines WL of the blocks to be erased drops to a negative value because of coupling between the word lines WL and the well voltage Vwell. The control gate line CGL is connected to the word lines WL of the blocks to be erased via the transfer transistors TTr, whereas the well voltage Vwell is applied to the control gate line. Therefore, the potential of the control gate line CGL is not dragged by the word lines WL of the blocks to be erased to a negative potential.

In the transfer transistors TTr of the row decoder circuit RD for the memory block, the control gate line potential is applied to the source of each transistor, 0 V is applied to the gate thereof, and the word line WLR potential (erase voltage Verase) is applied to the drain thereof. The potential of the control gate line CGL is kept at the positive voltage VDD-Vth. This avoids problems that the potential of the control gate line CGL drops to a negative potential in conjunction with word lines WL of the blocks to be erased to undesirably allow a current to flow through the transfer transistors TTr for the memory block to disassociate the word line WLR of the memory block from the well potential Vwell, whereby the potential of the control gate line varies in the same manner as in the well voltage Vwell. This avoids a problem that the electrons are extracted from the floating gate electrodes of the memory cell transistors MT of the memory block because of a potential difference between the word line WLR in the memory block and the well voltage Vwell.

Next, at time T5, the discharge of the well voltage Vwell ends. At this end, the signal CGWELL is made low. Moreover, the signal CGDIS is made high to turn on the transistor TrG, thereby discharging the control gate line CGL.

It has been described above that the signal CGDIS is made low and the signal CGWELL is made high prior to the start (time T4) of the discharge of the well voltage Vwell. However, the signal CGDIS can be controlled to turn off before or after the start of the discharge of the well voltage Vwell. More specifically, the signal CGDIS may be turned off before the end (time T5) of the discharge of the well voltage Vwell. Consequently, a discharge path of the control gate line CGL is cut. This avoids problems that the potential of the control gate line CGL drops earlier than the well voltage Vwell to undesirably erase the data of the memory block.

Moreover, one end of the current path of the transistor TrW may not be connected to the well, but may be connected to a supply end of a positive power potential. This also allows the same advantage as the end of the current path connected to the well. Furthermore, when the end is connected to the well, it is possible to obtain an advantage that any additional current consumption by the application of the embodiment does not occur. This is because the well is provided with a voltage for the operation irrespective of the application of the embodiment, and this voltage of the well is utilized.

Furthermore, entire block erasure has been described above, but the present embodiment is not limited to this erasure. For example, also when the data of a plurality of blocks among all the blocks is erased, the present embodiment can be applied to avoid erroneous erasure of the memory block.

As described above, according to the semiconductor memory device of the embodiment, the control gate line is electrically connected to the well voltage at the start of the discharge of the well voltage during the collective erasure of the plurality of blocks. This avoids the problem that the control gate line has a negative potential because of the influence of the word lines of the block to be erased connected to this control gate line and that the potential of the word lines of the memory block rapidly drops to produce a large potential difference between the well voltage and the word-line voltage in the memory block. Therefore, it is possible to prevent the data of the memory block being wrongly erased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a semiconductor substrate which comprises a well;
a memory cell array which comprises memory cells each comprising a floating gate electrode above the well and a control gate electrode above the floating gate electrode, and configured to write data in units of pages each comprising memory cells connected in series and to erase data in units of blocks each comprising a plurality of the pages;
a control gate line selectively electrically connected to the control gate electrodes of at least one of the blocks; and
a first switching element which comprises a current path having ends connected to the control gate line and a ground end,
wherein the well is charged, and the first switching element is turned off before the end of the discharge of the well.

2. The device of claim 1, further comprising:
a second switching element comprising a current path having ends connected to the control gate line and a positive voltage end which supplies a positive first voltage,
wherein the second switching element is turned on before the end of a discharge of the well.

3. The device of claim 2, wherein the first voltage is a voltage of the well.

4. The device of claim 1, wherein the first switching element is turned off before the start of a discharge of the well.

5. The device of claim 1, wherein the charge of the well and the discharge of the well are performed during erasure of data in all blocks of the memory cell array.

6. The device of claim 5, wherein the blocks include a memory block which holds information necessary for an operation of the semiconductor memory device, and the control gate electrodes of the memory block are made to float during the erasure of data in all blocks.

7. A semiconductor memory device comprising:
a semiconductor substrate which comprises a well;
a memory cell array which comprises memory cells each comprising a floating gate electrode above the well and a control gate electrode above the floating gate electrode, and configured to write data in units of pages each comprising memory cells connected in series and to erase data in units of blocks each comprising a plurality of the pages;
a control gate line selectively electrically connected to the control gate electrodes of at least one of the blocks;
a first switching element which comprises a current path having ends connected to the control gate line and a ground end; and
a second switching element comprising a current path having ends connected to the control gate line and a positive voltage end which supplies a positive first voltage,
wherein the well is charged, and the first switching element is turned off and the second switching element is turned on before the start of a discharge of the well.

8. The device of claim 7, wherein the first voltage is a voltage of the well.

9. The device of claim 7, wherein the charge of the well and the discharge of the well are performed during erasure of data in all blocks of the memory cell array.

10. The device of claim 9, wherein the blocks include a memory block which holds information necessary for an operation of the semiconductor memory device, and the control gate electrodes of the memory block are made to float during the erasure of data in all blocks.

* * * * *